US005793126A

United States Patent [19]
Gray

[11] Patent Number: 5,793,126
[45] Date of Patent: Aug. 11, 1998

[54] POWER CONTROL CHIP WITH CIRCUITRY THAT ISOLATES SWITCHING ELEMENTS AND BOND WIRES FOR TESTING

[75] Inventor: Richard L. Gray, Alameda, Calif.

[73] Assignee: Elantec, Inc., Milpitas, Calif.

[21] Appl. No.: 564,656

[22] Filed: Nov. 29, 1995

[51] Int. Cl.[6] .................................................. H03K 17/04
[52] U.S. Cl. ................. 307/125; 307/116; 340/825.79; 340/825.85; 364/481; 257/107; 257/146
[58] Field of Search ..................... 307/125, 116; 340/825.86, 825.79, 825.85; 364/490, 481; 257/107, 146

[56] References Cited

U.S. PATENT DOCUMENTS

| | | | |
|---|---|---|---|
| 3,786,425 | 1/1974 | Hethrington et al. | 340/825.86 |
| 3,875,563 | 4/1975 | Hosokawa et al. | 340/825.86 |
| 3,909,636 | 9/1975 | Masaki et al. | 326/126 |
| 4,130,827 | 12/1978 | D'Altroy et al. | 257/146 |
| 4,977,341 | 12/1990 | Stein | 327/380 |
| 5,452,229 | 9/1995 | Shankar et al. | 364/489 |

*Primary Examiner*—William M. Shoop, Jr.
*Assistant Examiner*—Albert W. Paladini
*Attorney, Agent, or Firm*—Fliesler, Dubb, Meyer & Lovejoy, LLP

[57] ABSTRACT

An integrated circuit chip with multiple switching element segments that cooperatively provide high power switching is provided with circuitry for isolating each individual switching element segment. The individual isolation of switching element segments enables bond wire continuity testing.

5 Claims, 3 Drawing Sheets

POWER CONTROL CHIP WITH CIRCUITRY THAT ISOLATES SWITCHING ELEMENTS AND BOND WIRES FOR TESTING

BACKGROUND OF THE INVENTION

1. Field of the Invention

The present invention pertains to the field of power control integrated circuits. More particularly, this invention relates to a power control chip that includes segmented power switching elements and control circuitry for isolating the power switching segments.

2. Art Background

Prior power control circuits such as voltage converters typically include one or more power switching elements along with associated control circuitry. Typically, such power switching elements provide the high power switching functions required to supply high levels of electrical power to load circuitry while the control circuitry precisely controls the duty cycle of the switching elements.

Such prior power switching elements such as power transistors are typically implemented with process technologies that are optimized for high power functions. On the other hand, such prior control circuitry is usually implemented with process technologies that minimize electrical power consumption. Such low power process technologies include, for example, complementary metal oxide semiconductor (CMOS) process technologies.

Unfortunately, such optimized process technologies are usually not well-suited for implementing both power transistors and control circuitry on a monolithic integrated circuit device. For example, CMOS processes that are well suited for implementing relatively complex and low power control circuitry typically cannot provide the current capacity requirements for power transistors. In addition, the metalization layers of prior CMOS process technologies typically provide an electrical current capacity that is well below the amount required for high power transistors.

One prior approach to implementing both high and low power circuits on a monolithic integrated circuit is to employ a hybrid process technology. Such a hybrid process usually enables the formation of both high and low power circuitry. Unfortunately, such specialized hybrid processes typically impose high manufacturing costs. In addition, fabrication facilities (fabs) for such hybrid processes are generally less available in comparison to CMOS or high power fabs.

Another prior approach to implementing both high and low power circuitry on a monolithic integrated circuit is to employ a low power process such as CMOS and to implement the required power transistors as a transistor with multiple bond wires. Multiple bond wire connections are typically employed to couple the transistor to the lead fingers of the integrated circuit device package. Such multiple connections usually overcome the limited electrical current capacity and high impedance of individual bond wires and metalization by spreading the current over many bond wires and large areas of metalization.

Prior integrated circuit device packages that employ such multiple bond wire connections usually pose special problems for device testing. For example, individual bond wire connections to a given lead finger may fail during manufacture of the chip package. Unfortunately, such failures are usually difficult to detect during normal manufacturing test procedures. For example, such individual bond wire failures typically pass a lead finger continuity check because parallel electric current paths are provided by the remaining bond wires that correspond to the failed bond wire connection.

Such an individual failure of a bond wire may increase the overall impedance between pairs of lead fingers. However, such impedance variation may be well within the process variation parameters of the particular manufacturing process. As a consequence, an impedance measurement between individual lead fingers may not detect failures of individual bond wire connections.

Such undetectable failures of individual bond wire connections requires that the remaining connected bond wires conduct the excess electrical current of the failed connection. Such increased demands on the remaining bond wire connections usually causes long-term reliability problems for such device packages by increasing the likelihood of bond wire failures during normal use.

One prior approach to reducing such reliability problems is to implement extra bond wire connections between lead fingers over and above the number of connections normally required for the desired electrical current capacity of the lead finger connections. Unfortunately, such redundancy in bond wire connections typically increases the overall manufacturing costs for such integrated circuit device packages.

SUMMARY AND OBJECTS OF THE INVENTION

One object of the present invention is to enable high power switching circuitry and power control circuitry to coexist on a monolithic integrated circuit chip.

Another object of the present invention is to improve the testability of a monolithic integrated circuit chip that contains both power switching elements and control circuitry.

Another object of the present invention is to improve the long-term reliability of a monolithic power control chip that includes segmented power switching elements.

A further object of the present invention is to improve the testability and reliability of a monolithic power control circuit that employs multiple bond wire connections to the lead fingers of a chip package.

These and other objects are provided by an integrated circuit chip having a high power switching element subdivided into a plurality of switching element segments that cooperatively provide high power switching functions. The integrated circuit chip also contains circuitry for isolating each individual switching element segment. The individual isolation of switching element segments enables continuity testing on corresponding pairs of bond wires of the integrated circuit chip.

Other objects, features and advantages of the present invention will be apparent from the detailed description that follows.

BRIEF DESCRIPTION OF THE DRAWINGS

The present invention is described with respect to particular exemplary embodiments thereof and reference is accordingly made to the drawings in which.

DETAILED DESCRIPTION

Figure 1:
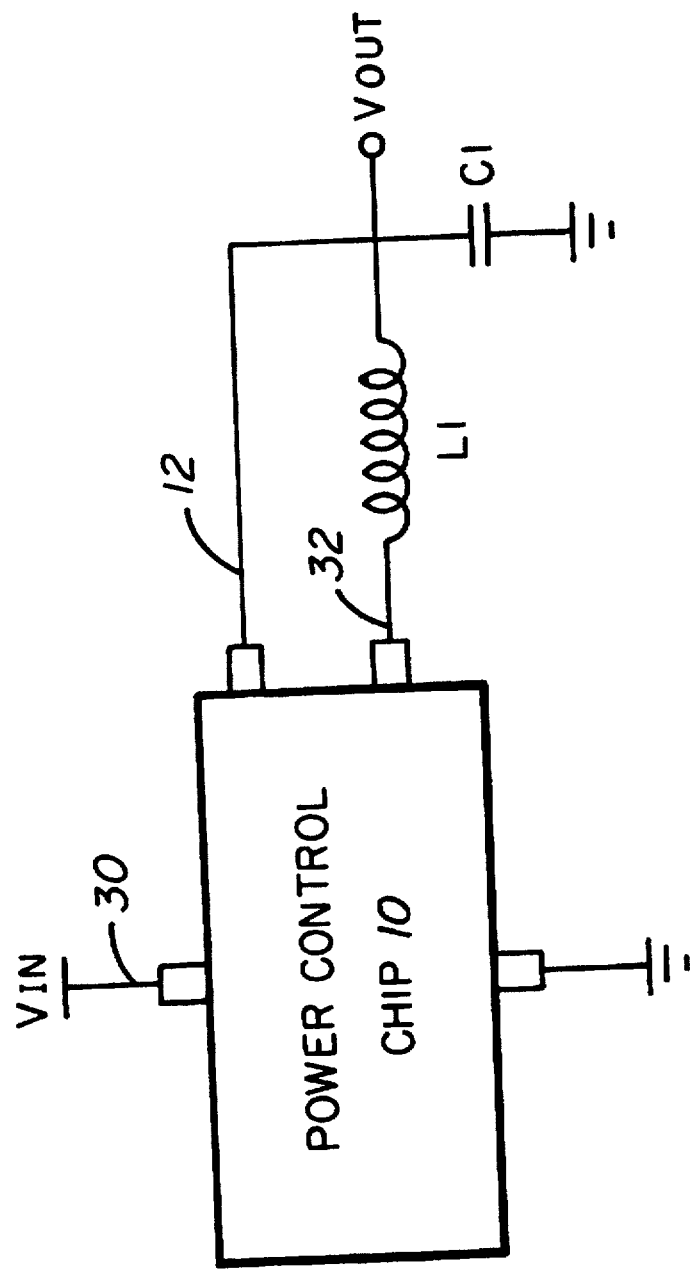
FIG. 1 illustrates a power converter circuit for one embodiment which includes a monolithic power control chip and an LC circuit.

FIG. 1 illustrates a power converter circuit that includes a power control chip 10, an inductor L1 and a capacitor C1. The power control chip 10 contains a monolithic integrated circuit (IC) that includes both power switching circuitry and power control circuitry. For one embodiment, the power control chip 10 is manufactured according to a complimentary metal oxide semiconductor (CMOS) process technology.

The power control chip 10 uses the input voltage VIN at a node 30 to generate a varying output supply voltage at a node 32 which is coupled to an output filter LC circuit comprising the inductor L1 and the capacitor C1. The LC circuit filters the output supply current on the node 32 and provides a substantially stable output voltage VOUT at an output node 12.

Figure 2:
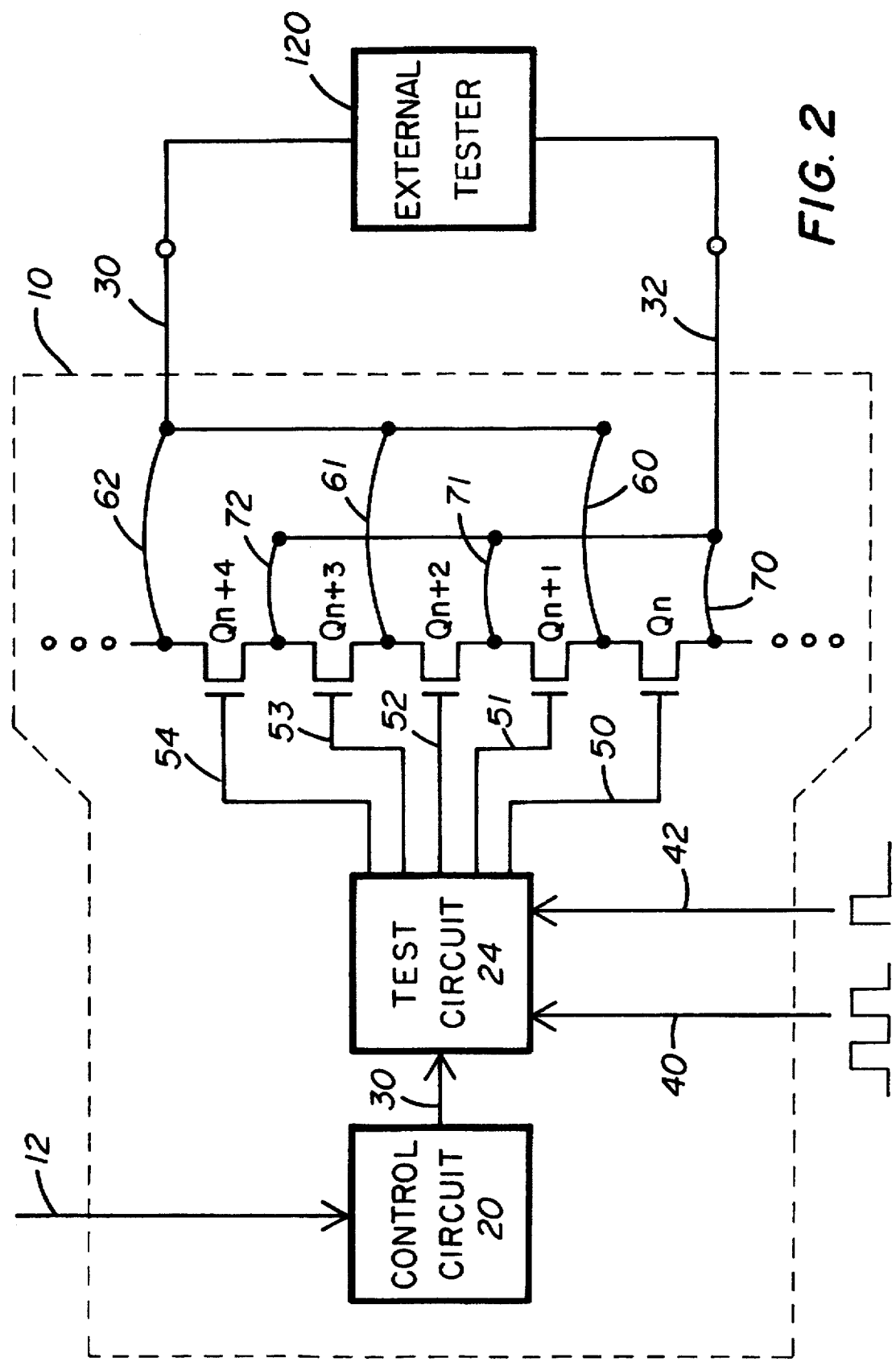
FIG. 2 illustrates the monolithic power control chip coupled to an external tester for one embodiment.

FIG. 2 illustrates the power control chip 10 coupled to an external tester 120 for one embodiment. The power control chip 10 includes a control circuit 20, a test circuit 4, and a set of transistor segments including the transistor segments $Q_n$ through $Q_{n+4}$.

The gates of the transistor segments $Q_n$ through $Q_{n+4}$ are individually controllable via a set of control signals 50–54. The test circuit 24 generates the control signals 50–54 that drive the gates of the transistor segments $Q_n$ through $Q_{n+4}$. The test circuit 24 provides a normal mode and a test mode for the power control chip 10.

The control circuit 20 generates an output control signal 30 for switching on and off the transistor segments $Q_n$ through $Q_{n+4}$. The test circuit 24 propagates the output control signal 30 to each of the control signals 50–54 to simultaneously switch on or off the transistor segments $Q_n$ through $Q_{n+4}$ during the normal mode of operation of the power control chip 10.

A pair of external lead fingers for the power control chip 10 correspond to the node 30 and the node 32. The node 30 is coupled to sources of the transistor $Q_n$ through $Q_{n+4}$ via a set of bond wires 60–62. The node 32 is coupled to drains of the transistors $Q_n$ through $Q_{n+4}$ via a set of bond wires 70–72.

The external tester 120 performs a continuity check between the nodes 30 and 32 during testing of the power control chip 10. The external test 120 generates a test clock signal 40 and a test pulse signal 42 to place test circuit 24 in the test mode for the power control chip 10. The test clock signal 40 and the test pulse signal 42 are input to the test circuit 24 via corresponding lead fingers and input bond wires (not shown) for the power control chip 10.

During the test mode, the control signal 30 is inactive and the test circuit 24 sequentially switches on and off each of the transistor segments $Q_n$ through $Q_{n+4}$ via the control signals 50–54. The sequential switching of the transistor segments $Q_n$ through $Q_{n+4}$ sequentially isolates individual pairs of the bond wires 60–62 and the bond wires 70–72.

Figure 3:
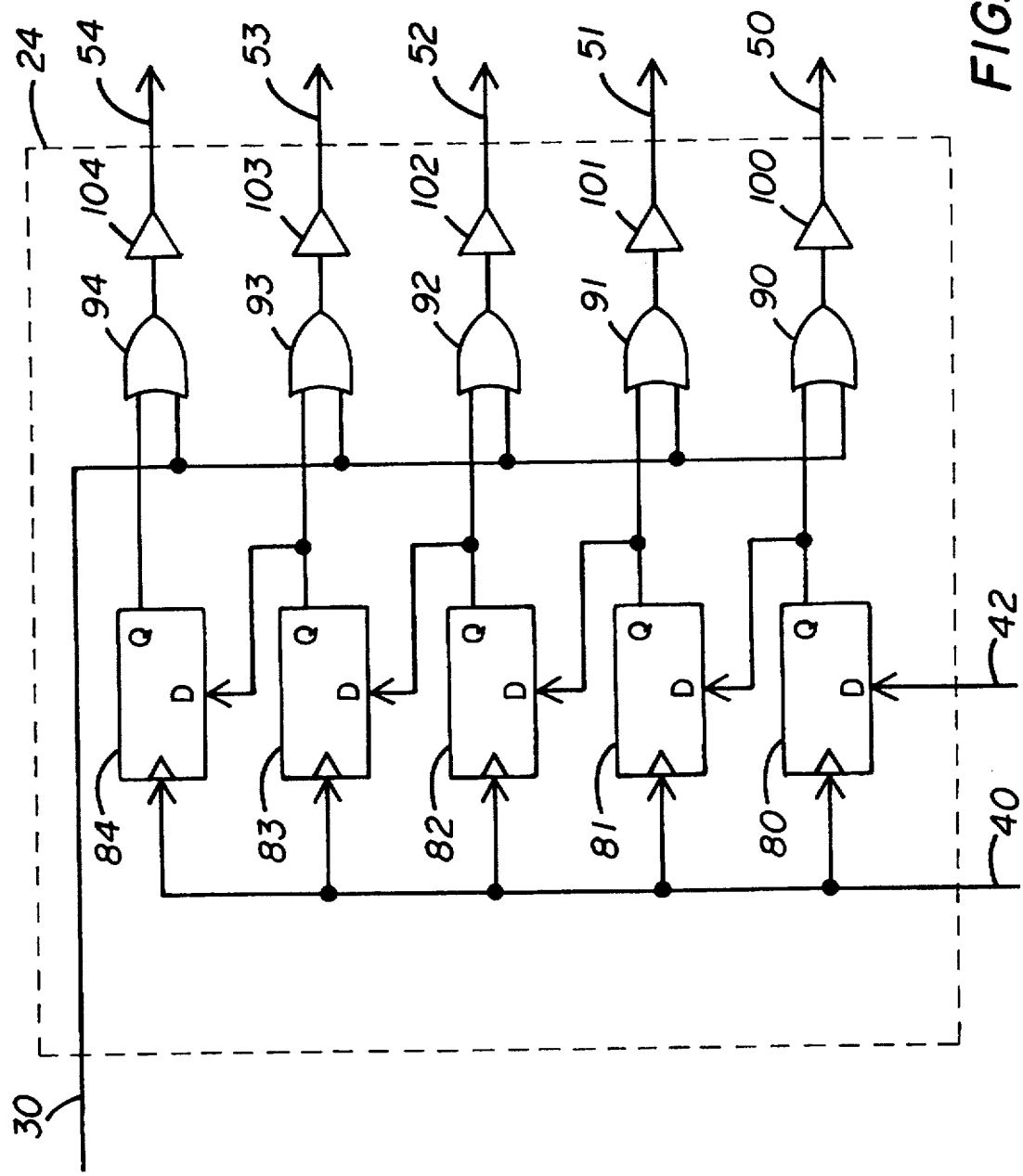
FIG. 3 illustrates a test circuit on the power control chip that isolates individual power switching elements and corresponding bond wires.

FIG. 3 illustrates the test circuit 24 in one embodiment. The test circuit 24 includes a set of data latches 80–84 along with a corresponding set of OR gates 90–94 and a corresponding set of driver circuits 100–104. The data latches 80–84 function as a shift register driven by the test clock signal 40 and the test pulse signal 42. Prior to the start of the test mode, the contents of the data latches 80–84 are clear and all of the Q outputs are inactive low.

Each of the data latches 80–84 is clocked by the test clock signal 40. The external tester 120 generates the test pulse signal 42 as a high pulse signal during the first cycle of the test clock signal 40. The test pulse signal 42 in combination with the test clock signal 40 initially loads the data (D) input of the data latch 80. The Q output of the data latch 80 goes high when the test clock signal loads the test pulse signal. The high Q output of the data latch 80 activates the control signal 50 through the OR gate 90.

The activated control signal 50 switches on the transistor segment $Q_n$ and isolates the bond wire 60 and the bond wire 70 for continuity checking by the external tester 120. At this point, a failure of either of the bond wires 60 or 70 causes the external tester to sense an open circuit between the nodes 30 and 32. The control signal 50 and the transistor segment $Q_n$ remain activated for one period of the test clock signal 40. Subsequent cycles of the test clock signal 40 propagate the test pulse signal from the Q output of the data latch 80 to the D inputs of the data latches 81, 82, 83, and 84, respectively. In this sequence, the control signal 50 is initially activated for one period of the test clock signal 40 followed by the control signals 51, 52, 53, and 54, respectively each for one period of the test clock signal 40.

This sequence of activation of the control signals 51–54 sequentially switches on and then off the transistor $Q_{n+1}$ followed by the transistor segment $Q_n,2$ followed by the transistor segment $Q_{n+3}$ and the transistor segment $Q_{n+4}$. As the test clock signal 40 sequentially activates the control signals 50–54 the external tester 120 performs continuity checks on each bond wire pair of the bond wires 60–62 and the bond wires 70–72.

The foregoing detailed description of the present invention is provided for the purposes of illustration and is not intended to be exhaustive or to limit the invention to the precise embodiment disclosed. Accordingly, the scope of the present invention is defined by the appended claims.

What is claimed is:

1. A power control chip, comprising:
  a plurality of high power switching transistors having source to drain paths connected in series; and
  a first lead finger;
  first bond wires, each bonded to a contact on a substrate of the chip and to the first lead finger for coupling the source of a respective one of the plurality of high power switching transistors to the first lead finger;
  a second lead finger;
  second bond wires, each bonded to a contact on a substrate of the chip and to the second lead finger for coupling the drain of a respective one of the plurality of high power switching transistors to the second lead finger; and test circuitry connected to the gates of the plurality of high power switching transistors, the test circuitry being controlled to selectively turn on transistors in the plurality of high power switching transistors so that a connection from the first lead finger to the second lead finger can be provided by a single one of the first bond wires and a single one of the second bond wires.

2. The power control chip of claim 1, wherein the test circuitry includes a shift register having outputs coupled to the gates of the high power switching transistors.

3. The power control chip of claim 2 further comprising:

OR gates, each OR gate having one input coupled to a respective one of the outputs of the shift register, a second input coupled to receive a signal for switching on and off the gates of the high power switching transistors substantially simultaneously, and an output coupled to the input of a respective one of the high power switching transistors.

4. The power control chip of claim 2 wherein the shift register comprises:

data latches, each data latch having an clock input, a data input and an output, wherein the output of each data latch forms one of the outputs of the shift register, and wherein the data input of each respective one of the data latches, except a first one of the data latches, is coupled to the output of a previous one of the data latches.

5. The power control chip of claim 4, wherein testing can be performed by a tester which applies signals to the clock inputs of the data latches and to the data input of an initial data latch and further is coupled to the first and second lead fingers to apply a signal to test continuity of the first and second bond wires.

* * * * *